(12) United States Patent
Hou et al.

(10) Patent No.: US 11,309,451 B2
(45) Date of Patent: Apr. 19, 2022

(54) FLAT PANEL DETECTOR AND MANUFACTURING METHOD THEREOF

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Xuecheng Hou, Beijing (CN); Chia Chiang Lin, Beijing (CN); Chuncheng Che, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 8 days.

(21) Appl. No.: 16/767,704

(22) PCT Filed: Dec. 9, 2019

(86) PCT No.: PCT/CN2019/124039
§ 371 (c)(1),
(2) Date: May 28, 2020

(87) PCT Pub. No.: WO2020/173170
PCT Pub. Date: Sep. 3, 2020

(65) Prior Publication Data
US 2021/0202779 A1     Jul. 1, 2021

(30) Foreign Application Priority Data

Feb. 26, 2019    (CN) .......................... 201910142582.X

(51) Int. Cl.
*H01L 29/74*    (2006.01)
*H01L 31/115*   (2006.01)
(Continued)

(52) U.S. Cl.
CPC ........ *H01L 31/115* (2013.01); *H01L 31/0224* (2013.01); *H01L 31/0256* (2013.01); *H01L 31/18* (2013.01); *H04N 5/32* (2013.01)

(58) Field of Classification Search
CPC ............... H01L 31/115; H01L 31/0224; H01L 31/0256; H01L 31/18; H04N 5/32
See application file for complete search history.

(56) References Cited

U.S. PATENT DOCUMENTS 6,340,818 B1 * 1/2002 Izumi ................ H01L 27/14609
                                                  250/208.1
7,645,976 B2    1/2010 Watanabe et al.
(Continued)

FOREIGN PATENT DOCUMENTS

| CN | 101228632 | 7/2008 |
|---|---|---|
| CN | 106206636 | 12/2016 |
| CN | 109727968 | 5/2019 |

*Primary Examiner* — Calvin Y Choi
(74) *Attorney, Agent, or Firm* — Leason Ellis LLP

(57) ABSTRACT

A flat panel detector and a manufacturing method thereof. The flat panel detector includes a first substrate and a second substrate. The first substrate includes a driving circuit, the second substrate includes a photosensitive element, the first substrate and the second substrate are arranged opposite to each other so as to be assembled, and the driving circuit is electrically connected with the photosensitive element to drive the photosensitive element. The flat panel detector not only can improve the filling rate of a photodiode in a pixel unit and increase the photosensitive area of the pixel unit in the flat panel detector, but also can effectively prevent static electricity and scratches generated during use and improve the photoelectric characteristics and yield of the flat panel detector.

20 Claims, 4 Drawing Sheets

(51) Int. Cl.
*H01L 31/0224* (2006.01)
*H01L 31/0256* (2006.01)
*H01L 31/18* (2006.01)
*H04N 5/32* (2006.01)

(56) References Cited

U.S. PATENT DOCUMENTS

| | | | |
|---|---|---|---|
| 9,048,094 B2 * | 6/2015 | Miyanaga | ......... H01L 21/02565 |
| 2008/0061678 A1 * | 3/2008 | Hamano | ............. H01L 27/3234 |
| | | | 313/498 |
| 2011/0073750 A1 | 3/2011 | Nagano et al. | |
| 2021/0167026 A1 * | 6/2021 | Miyamoto | .......... H01L 27/1463 |

* cited by examiner

FLAT PANEL DETECTOR AND MANUFACTURING METHOD THEREOF

This application is a U.S. National Stage Application under 35 U.S.C. § 371 of International Patent Application No. PCT/CN2019/124039, filed Dec. 9, 2019, which claims priority of China Patent application No. 201910142852.Z filed on Feb. 26, 2019, both of which are incorporated reference herein in their entireties.

TECHNICAL FIELD

Embodiments of the present disclosure relate to a flat panel detector and a manufacturing method thereof.

BACKGROUND

In recent years, X-ray detection has been widely used in various fields such as medical treatment, security, nondestructive test and scientific research. At present, the more common X-ray detection technology is the X-ray digital radiography (DR) detection technology that appeared in the late 1990s. A flat panel detector (FPD) is used in the X-ray digital photography detection technology, and may have a pixel size less than 0.1 mm, so its imaging quality and resolution can be almost comparable to that of a film photography system. At the same time, it also overcomes the shortcomings of film photography system and provides convenience for computer processing of images.

SUMMARY

At least one embodiment of the present disclosure provides a flat panel detector including a first substrate and a second substrate. The first substrate includes a driving circuit, the second substrate includes a photosensitive element, the first substrate and the second substrate are arranged opposite to each other so as to be assembled, and the driving circuit is electrically connected with the photosensitive element to drive the photosensitive element.

For example, in the flat panel detector provided by an embodiment of the present disclosure, the first substrate further includes a conductive connection portion. The conductive connection portion is electrically connected with the driving circuit, is disposed on a surface of the first substrate, and is electrically connected with the photosensitive element.

For example, in the flat panel detector provided by an embodiment of the present disclosure, the conductive connection portion includes a metal electrode, a conductive adhesive or a conductive spacer.

For example, in the flat panel detector provided by an embodiment of the present disclosure, the first substrate further includes a first passivation layer. The first passivation layer is disposed between the conductive connection portion and the driving circuit, the first passivation layer includes an opening region, and the conductive connection portion is disposed in the opening region.

For example, in the flat panel detector provided by an embodiment of the present disclosure, the first passivation layer is a planarization layer so that the first substrate has a substantially flat surface.

For example, in the flat panel detector provided by an embodiment of the present disclosure, the second substrate further includes a base substrate and a transparent electrode layer formed on the base substrate, and the photosensitive element is disposed at a side of the transparent electrode layer away from the base substrate and is electrically connected with the transparent electrode.

For example, the flat panel detector provided by an embodiment of the present disclosure further includes a conductive adhesive. The conductive adhesive is disposed between the first substrate and the second substrate to bond and assemble the first substrate with the second substrate.

For example, in the flat panel detector provided by an embodiment of the present disclosure, the driving circuit and the photosensitive element are at least partially overlapped in a direction in which the first substrate and the second substrate are right opposite to each other.

For example, in the flat panel detector provided by an embodiment of the present disclosure, the first substrate further includes a light shielding layer. The light shielding layer is disposed at a side of the driving circuit away from the first substrate, so as to be closer to the second substrate than the driving circuit.

For example, in the flat panel detector provided by an embodiment of the present disclosure, the first substrate includes a first base substrate, the second substrate includes a second base substrate, and the first base substrate or the second base substrate is made of glass or plastic.

For example, in the flat panel detector provided by an embodiment of the present disclosure, the photosensitive element includes a photodiode, and the photodiode is a photodiode of PIN type or a photodiode of PN type.

For example, in the flat panel detector provided by an embodiment of the present disclosure, a P-type layer, an I-type layer, and an N-type layer of the photodiode of PIN type are sequentially stacked in a direction in which the second substrate and the first substrate are opposite to each other.

For example, the flat panel detector provided by an embodiment of the present disclosure further includes a scan circuit, the scan circuit is connected with the driving circuit and is configured to provide a scan signal to control the driving circuit.

For example, the flat panel detector provided by an embodiment of the present disclosure further includes a voltage reading circuit, the voltage reading circuit is connected with the driving circuit and is configured to read a voltage signal generated by the photosensitive element through the driving circuit.

At least one embodiment of the present disclosure further provides a manufacturing method of a flat panel detector, which includes: forming a first substrate including a driving circuit; forming a second substrate including a photosensitive element; and oppositely arranging the first substrate and the second substrate so as to assemble the first substrate with the second substrate, so that the driving circuit is electrically connected with the photosensitive element.

For example, the manufacturing method provided by an embodiment of the present disclosure further includes: forming a first passivation layer including an opening region on the driving circuit; and forming a conductive connection portion in the opening region to connect the driving circuit with the photosensitive element.

For example, the manufacturing method provided by an embodiment of the present disclosure further includes: providing a light shielding layer at a side of the driving circuit away from the first substrate, so that the light shielding layer is closer to the second substrate than the driving circuit after oppositely arranging the first substrate and the second substrate so as to assemble the first substrate with the second substrate.

For example, in the manufacturing method provided by an embodiment of the present disclosure, forming the second substrate including the photosensitive element includes forming a transparent electrode layer on a base substrate of the second substrate, and forming the photosensitive element at a side of the transparent electrode layer away from the second substrate.

For example, the manufacturing method provided by an embodiment of the present disclosure further includes: providing a conductive adhesive between the first substrate and the second substrate to bond and assemble the first substrate with the second substrate.

BRIEF DESCRIPTION OF THE DRAWINGS

In order to clearly explain the technical solution in the embodiments of the present disclosure, the drawings of the embodiments will be briefly introduced in the following. Apparently, the described drawings in the following are only some embodiments of the present disclosure without construing any limitation to the present disclosure.

DETAILED DESCRIPTION

Figure 1A:
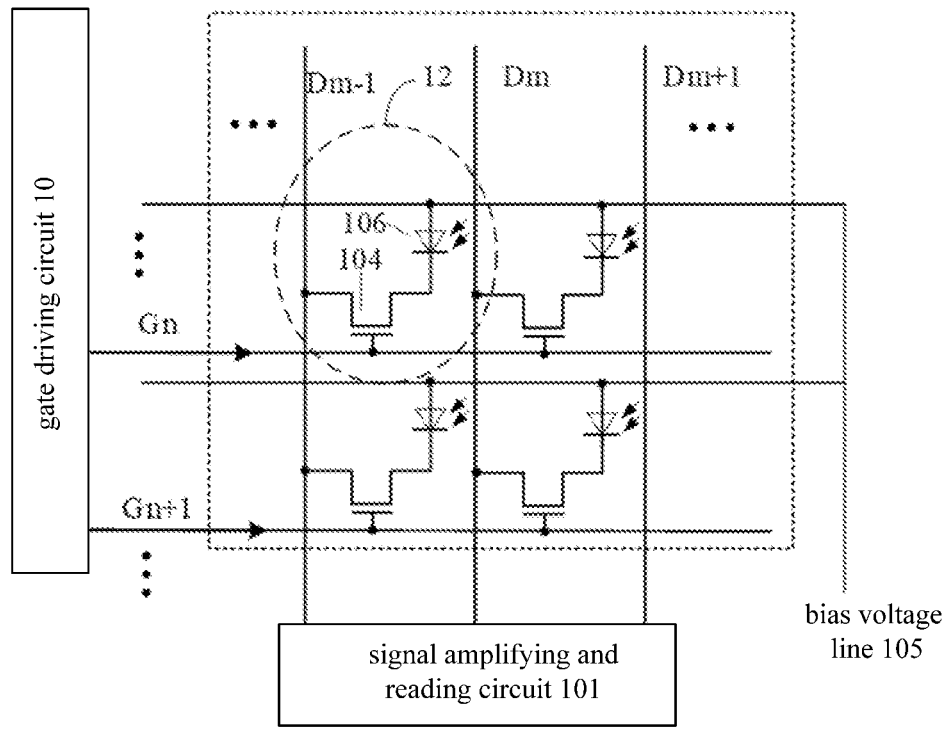
FIG. 1A is a schematic circuit diagram of a flat panel detector.

For more clear understanding of the objectives, technical details and advantages of the embodiments of the present disclosure, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise", "comprising", "include", "including", etc., are intended to specify that the elements or the objects stated before these terms encompass the elements or the objects and equivalents thereof listed after these terms, but do not preclude the other elements or objects. The phrases "connect", "connected" and the like are not limited to a physical or mechanical connection, but also include an electrical connection, either directly or indirectly. "On," "under," "right," "left" and the like are only used to indicate relative position relationship, and when the position of the described object is changed, the relative position relationship may be changed accordingly.

The present disclosure will be described below by several specific embodiments. In order to keep the following description of embodiments of the present disclosure clear and concise, detailed descriptions of known functions and known components may be omitted. In the case that any component of an embodiment of the present disclosure appears in more than one drawing, the component is denoted by the same reference numeral in each drawing.

According to different photoelectron conversion modes involved in imaging, digital X-ray flat panel detectors may be divided into two types: a direct conversion (Direct DR) type and an indirect conversion (Indirect DR) type. FIG. 1A illustrates a schematic circuit diagram of a flat panel detector of indirect conversion type. As illustrated in FIG. 1A, the X-ray flat panel detector of indirect conversion type includes a gate driving circuit 10, a signal amplifying and reading circuit 101, and a plurality of pixel units 12 arranged in an array. For example, in some exemplary embodiments, each of the plurality of pixel units 12 includes a thin film transistor 104, a photodiode 106, a storage capacitor, and an X-ray conversion layer (not illustrated) formed of a scintillator (cesium iodide) or a phosphor (Gadolinium oxysulfide). For example, the storage capacitor may be provided separately or may be formed by electrodes located on upper and lower sides of the photodiode 106 (e.g., a transparent electrode and a second electrode of a thin film transistor T, which will be described in detail later respectively), i.e., to form a reverse biased photodiode capacitor. For example, in other exemplary embodiments, the pixel unit may further include a reset transistor and a switch transistor (not illustrated) connected with the above-mentioned thin film transistor 104 and the photodiode 106. For example, the reset transistor is controlled by a reset signal to be in an on state or in an off state, and upon the reset transistor being turned on, a voltage of a gate electrode of the switch transistor is controlled to be an off voltage; the switch transistor is a source follower and works in a linear state. For example, the gate electrode of the switch transistor is also connected with an end of the photodiode so that a source output voltage of the switch transistor changes with a voltage on the photodiode, and the gain of the switch transistor is slightly less than 1. The thin film transistor 104 still serves as an output transistor and controls an output voltage of the source electrode of the switch transistor under the control of a gate scan signal. For example, the gate driving circuit 10 is connected with pixel units 12 of n rows through n gate lines, respectively; the signal amplifying and reading circuit 101 is connected with pixel units 12 of m columns through m data lines, respectively; and the pixel units 12 of n rows are also connected with n bias voltage lines 105 so as to receive bias voltages, respectively. As illustrated in FIG. 1A, Gn refers to a gate line connected with the pixel units of the nth row, Gn+1 refers to a gate line connected with the pixel units of the (n+1)th row, Dm−1 refers to a data line connected with the pixel units of the (m−1) column, Dm refers to a data line connected with the pixel units of the m column, and Dm+1 refers to a data line connected with the pixel units of the (m+1)th column.

For example, the photodiode 106 operates under a bias voltage (reverse voltage) provided by a bias voltage line

105. Upon X-rays being irradiated on the array substrate, the X-ray conversion layer converts the X-rays into visible light (for example, light with a wavelength range of 350 nm to 770 nm); upon the visible light being irradiated on the photodiode, the visible light is converted into an electrical signal by the photodiode 106; and for example, the electrical signal is stored by a storage capacitor. Then, thin film transistors 104 are turned on row by row under an action of gate scan signals provided row by row and provided by a gate driving circuit 10, charges converted by the photodiode 106 are transmitted to the signal amplifying and reading circuit 101 through the data line, the signal amplifying and reading circuit 101 performs further amplification, analog/digital conversion and other processing on the electrical signal to obtain a digital signal, and transmits the digital signal to an image processing system (e.g., CPU or GPU) of a computer to form an X-ray image.

Figure 1B:
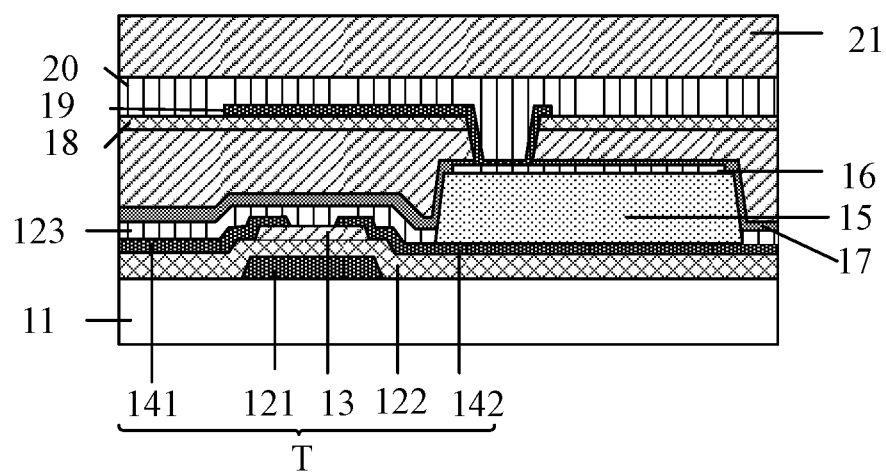
FIG. 1B is a schematic structural diagram of a flat panel detector.

FIG. 1B is a schematic structural diagram of a flat panel detector. As illustrated in FIG. 1B, the flat panel detector includes a base substrate 11, and a thin film transistor T, a photodiode 15, a transparent electrode 16, a bias voltage line 19, a passivation layer 20, a protective layer 21, etc. that are formed on the base substrate 11. A manufacturing method of the flat panel detector includes the following steps.

Firstly, forming a gate electrode 121 of a thin film transistor T on a base substrate 11; sequentially forming a gate insulation layer 122 and an active layer 13 on the gate electrode 121; and forming a first electrode (e.g., a source electrode) 141 and a second electrode (e.g., a drain electrode) 142 of the thin film transistor T on the active layer 13. For example, the gate electrode 121 of the thin film transistor T is connected with a gate driving circuit 10 through a gate line to receive a gate scan signal (referring to FIG. 1A), the second electrode 142 of the thin film transistor is connected with a photodiode 15 (to be formed in the following step) through a via hole in the first passivation layer 123, and the first electrode 141 of the thin film transistor is connected with a signal amplifying and reading circuit 101 through a data line (referring to FIG. 1A) to read an electrical signal generated by the photodiode 15 upon the thin film transistor T being turned on under the control of the gate scan signal.

It should be noted that a material of the active layer 13 may include any one selected from the group consisting of an oxide semiconductor, an organic semiconductor, amorphous silicon, and polysilicon. For example, the oxide semiconductor includes a metal oxide semiconductor (e.g., indium gallium zinc oxide (IGZO)), and the polysilicon includes low-temperature polysilicon or high-temperature polysilicon, etc.

For example, a material of the gate insulation layer 122 may include an inorganic insulation material such as SiNx, SiOx, or SiNxOy, an organic insulation material such as organic resin, or other suitable materials.

Secondly, forming a first passivation layer 123 on the first electrode 141 and the second electrode 142 of the thin film transistor T, and forming a photodiode 15 on the first passivation layer 123, and forming a transparent electrode layer 16 arranged continuously on the photodiode 15. For example, the first passivation layer 123 includes an opening region (i.e., a via hole), through which the photodiode 15 is connected with the second electrode 142 of the thin film transistor T, so that an electrical signal generated by the photodiode 15 is transmitted to the signal amplifying and reading circuit 101 through the second electrode 142 and the first electrode 141 of the thin film transistor T.

For example, a buffer insulation layer 17 and a second passivation layer 18 are formed on the transparent electrode layer 16, a bias voltage line 19 is formed on the second passivation layer 18, the bias voltage line 19 is electrically connected with a bias terminal, and the bias voltage line 19 is connected with the transparent electrode layer 16 through a via hole in the buffer insulation layer 17 and the second passivation layer 18, thereby providing a negative bias voltage to the transparent electrode layer 16 and enabling the photodiode to be in an operating state.

Finally, forming a third passivation layer 20 on the bias voltage line 19, and forming a silicon nitride layer having a thickness about 1 μm or an organic resin layer having a thickness of 1 to 2 μm on the third passivation layer 20 as a protective layer 21 of the photodiode. Alternatively, the protective layer 21 may be a multilayer composite protective film including an inorganic layer and an organic layer.

For example, the materials of the first passivation layer 123, the buffer insulation layer 17, the second passivation layer 18, and the third passivation layer 20 may be the same as those of the gate insulation layer 122, including, for example, an inorganic insulation material such as SiNx, SiOx, or SiNxOy, an organic insulation material such as organic resin, or other suitable materials.

As can be seen from the above steps, the photodiode and the thin film transistor are formed on the same substrate 11. If the flat panel detector with this structure is adopted, in the case where a size of the pixel unit is 140 μm, a filling rate of the pixel unit, that is, a photosensitive area of the pixel unit of the flat panel detector is generally about 60% of a total area of the pixel unit, which results in a relatively low effective photosensitive area of the flat panel detector. Therefore, upon using the same dose of X-ray, the sensitivity of the image acquired by the flat panel detector is low, which will affect the diagnosis of fine tissue structures in medical applications. In particular, with the resolution of flat panel detector increases, the size of a single pixel unit is reduced from 140 μm to 75 μm. In this case, the filling rate of the pixel unit is only about 40%, which severely restricts its application in fine diagnosis fields (such as dentistry, breast and other fields).

In addition, because a silicon nitride layer having a thickness of 1 μm or an organic resin layer having a thickness of 1 to 2 μm is disposed on a surface of the photodiode as a protective layer, the flat panel detector has poor anti-external-static electricity ability and poor scratch resistance, and static electricity or scratches are easy to occur in the process of detecting and attaching the flat panel detector with the scintillator, thereby easily causing the failure phenomenon of the photodiode.

An embodiment of the present disclosure provides a flat panel detector including a first substrate and a second substrate. The first substrate includes a driving circuit, the second substrate includes a photosensitive element, the first substrate and the second substrate are arranged opposite to each other so as to be assembled, and the driving circuit is electrically connected with the photosensitive element to drive the photosensitive element. At least one embodiment of the present disclosure further provides a manufacturing method of the flat panel detector.

For the flat panel detector provided by the above embodiment of the present disclosure, on the one hand, the manufacturing process of the flat panel detector is relatively simple, and is formed by assembling two oppositely arranged substrates; and in this structure, the photosensitive element can be disposed as a whole layer on an entire surface of one of the substrates, so that the filling rate (i.e., photosensitive area) of the photosensitive element in the pixel unit can be effectively improved, and the photosensitive performance of the flat panel detector can be improved, so that the flat panel detector can be applied to the field of fine diagnosis and the like; on the other hand, upper and lower surfaces of the flat panel detector are made of substrate materials, so that static electricity and scratches can be effectively prevented and the photoelectric characteristics and yield of the flat panel detector can be improved in the process of detecting or attaching the flat panel detector with the scintillator.

Hereinafter, embodiments of the present disclosure and some exemplary embodiments thereof will be described in detail with reference to the accompanying drawings.

Figure 2:
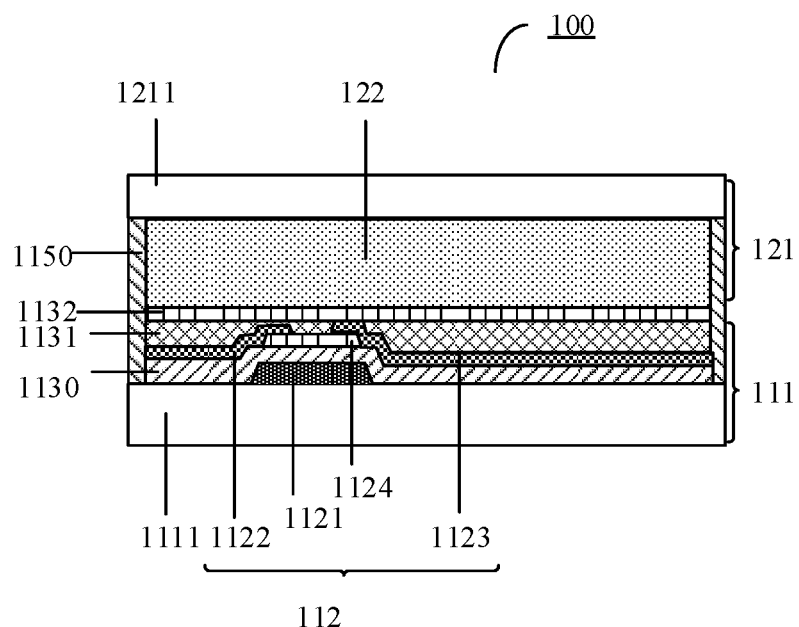
FIG. 2 is a schematic structural diagram of a flat panel detector provided by some embodiments of the present disclosure.

FIG. 2 is a schematic structural diagram of a flat panel detector provided by at least one embodiment of the present disclosure. For example, the flat panel detector can be used to form an X-ray image in the field of fine diagnosis and has better photosensitive performance.

In some exemplary embodiments, as illustrated in FIG. 2, the flat panel detector 100 includes a first substrate 111 and a second substrate 121. The first substrate 111 includes a driving circuit 112, and the second substrate 121 includes a photosensitive element 122. The first substrate 111 and the second substrate 121 are arranged opposite to each other, so as to be assembled, for example, through a sealant 1150, so that the driving circuit 112 is electrically connected with the photosensitive element 122 to drive the photosensitive element 122. For example, the driving circuit 112 and the photosensitive element 122 are at least partially overlapped in a direction in which the first substrate 111 and the second substrate 121 are right opposite to each other, thereby electrically connecting the driving circuit 112 with the photosensitive element 122. The sealant 1150 is applied around a periphery of the first substrate 111 or around a periphery of the second substrate 121. For example, after the first substrate 111 and the second substrate 121 are assembled and bonded together, the sealant 1150 is cured by heat or light.

For example, the driving circuit 112 may include transistors, such as a field effect transistor, a thin film transistor, etc., and may also include a storage capacitor, etc. as required. The photosensitive element 122 may include a photodiode or other organic photosensitive material. For example, the photodiode is a photodiode of PN type, a photodiode of PIN type, or the like. For example, a material of the photodiode of PIN type is monocrystalline silicon, and a P-type layer, an I-type layer, and an N-type layer are sequentially stacked in a direction in which the second substrate 121 and the first substrate 111 are opposite to each other. For example, the P-type layer, the I-type layer, and the N-type layer are sequentially formed on the second substrate 121 in a direction from the second substrate 121 pointing to the first substrate 111, thereby forming a photodiode of PIN type on the second substrate 121.

For example, the first substrate 111 further includes a first base substrate 1111, the second substrate 121 further includes a second base substrate 1211, and a driving circuit 112 is disposed on the first base substrate 1111, and the photosensitive element 122 is disposed on the second base substrate 1211. The following embodiments are the same as the above and will not be described again. For example, the first base substrate 1111 or the second base substrate 1211 may be made of, for example, glass, plastic, quartz, or other suitable materials, which is not limited in the embodiments of the present disclosure.

For example, the driving circuit 112 may be obtained by a semiconductor manufacturing process in the art. Hereinafter, a manufacturing method of the driving circuit 112 in the case where the driving circuit 112 is a thin film transistor, will be described, by way of example. For example, firstly, forming a gate electrode 1121 of a thin film transistor 112 on the first substrate 111; sequentially forming a gate insulation layer 1130 and an active layer 1124 on the gate electrode 1121; forming a first electrode (e.g., a source electrode) 1122 and a second electrode (e.g., a drain electrode) 1123 of the thin film transistor 112 on the active layer 1124. For example, in this exemplary embodiment, the gate electrode 1121 of the thin film transistor 112 is connected with the gate driving circuit 10 illustrated in FIG. 1A through a gate line to receive a gate scan signal, the second electrode 1123 of the thin film transistor 112 is connected with the photosensitive element 122 through a via hole in a first passivation layer 1131 (described below in detail), the first electrode 1122 of the thin film transistor 112 is connected with a signal amplifying and reading circuit 101 illustrated in FIG. 1A through a data line, so that the signal amplifying and reading circuit 101 reads the electric signal generated by the photosensitive element 122 upon the thin film transistor 112 being turned on under the control of a gate scan signal, and converts the electric signal into a digital signal, and transmits the digital signal to an image processing unit (e.g., CPU, GPU, etc.) to form an X-ray image.

For example, the materials used for the first electrode 1122, the second electrode 1123, and the gate electrode 1121 of the thin film transistor 112 may include aluminum, aluminum alloy, copper, copper alloy, or any other suitable materials, which are not limited in the embodiments of the present disclosure.

It should be noted that the material of the active layer 124 may include an oxide semiconductor, an organic semiconductor, or amorphous silicon, polysilicon, etc. For example, the oxide semiconductor includes a metal oxide semiconductor (e.g., indium gallium zinc oxide (IGZO)), and the polysilicon includes low-temperature polysilicon or high-temperature polysilicon, etc., which is not limited in the embodiments of the present disclosure.

For example, a material of the gate insulation layer 1130 may include an inorganic insulation material such as SiNx, SiOx, or SiNxOy, an organic insulation material such as organic resin, or other suitable materials, which is not limited in the embodiments of the present disclosure.

For example, the first substrate 111 further includes a first passivation layer 1131, which may serve as a planarization layer such that the first substrate 111 has a substantially flat surface. For example, the second electrode 1123 of the thin film transistor 112 may be electrically connected with the photosensitive element 122 included in the second substrate 121 through a via hole in the first passivation layer 1131. It should be noted that a material of the first passivation layer 1131 may be the same as that of the gate insulation layer 1130, without particularly repeated here.

For example, the photosensitive element 122 may be disposed on an entire surface of the second substrate 121, thereby improving the filling rate of photodiode in the pixel unit, i.e., the photosensitive area of the flat panel detector, improving the photosensitive performance of the flat panel detector, and facilitating its application in the field of fine diagnosis. Moreover, the flat panel detector 100 is formed by two substrates (i.e., the first substrate 111 and the second substrate 121) arranged opposite to each other, and the first substrate 111 and the second substrate 121 are bonded together by a sealant 1150 so as to be assembled, so that the manufacturing process is relatively simple.

In addition, the upper and lower surfaces of the flat panel detector are made of substrate materials, so that static electricity and scratches can be effectively prevented and photoelectric characteristics and yield of the flat panel detector can be improved in the process of detecting or attaching the flat panel detector with the scintillator.

In other exemplary embodiments, for example, on the basis of the exemplary embodiment illustrated in FIG. 2, the flat panel detector further includes a conductive adhesive 1132. For example, the conductive adhesive 1132 is disposed between the first substrate 111 and the second substrate 121 to further bond and assemble the first substrate 111 with the second substrate 121. For example, in the present exemplary embodiment, the conductive adhesive 1132 may be disposed between the first passivation layer 1131 and the photosensitive element 122 to bond and assemble the first passivation layer 1131 with the photosensitive element 122, that is, to bond and assemble the first substrate 111 with the second substrate 121. For example, the conductive adhesive 1132 may be directly coated on the photosensitive element 122. For example, in the case where the photosensitive element is a photodiode of PIN type, that is, the photosensitive element 122 includes a P-type layer, an I-type layer, an N-type layer, and the conductive adhesive 1132 that are disposed in sequence, which is not limited in the embodiment of the present disclosure.

For example, the conductive adhesive 1132 includes a base resin and a conductive filler, i.e., conductive particles. The conductive particles are bonded together by the bonding effect of the base resin to form a conductive path, thereby realizing conductive connection of the adhered materials (e.g., the driving circuit 112 and the photosensitive element 122). The conductive adhesive 1132 is divided into isotropic conductive adhesive and anisotropic conductive adhesive according to the conductive direction. For example, an anisotropic conductive adhesive (ACA) may be used in the flat panel detector 100, i.e., anisotropic conductive adhesive is conductive in one direction such as the Z direction (i.e., the direction in which the conductive adhesive is pressed) and is non-conductive in the X and Y directions (perpendicular to the pressing direction). That is, the ACA is conductive in the direction in which the second substrate 121 and the first substrate 111 are opposite to each other, and is non-conductive in the direction perpendicular to the direction in which the second substrate 121 and the first substrate 111 are opposite to each other, thereby ensuring that the electrical connection characteristics of the driving circuit 112 and the photosensitive element 122 remain unchanged while adhering and fixing the first substrate 111 with the second substrate 121.

Figure 3:
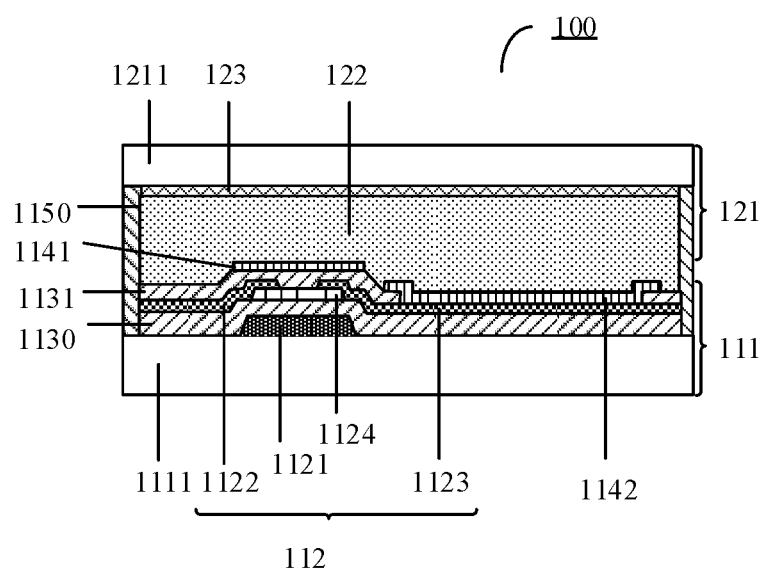
FIG. 3 is a schematic structural diagram of another flat panel detector provided by some embodiments of the present disclosure.

FIG. 3 is a schematic structural diagram of another flat panel detector provided by at least one embodiment of the present disclosure. As illustrated in FIG. 3, the flat panel detector is similar in structure to the flat panel detector illustrated in FIG. 2, except that the first substrate 111 further includes a light shielding layer 1141 and/or a conductive connection portion 1142, in addition, the second substrate 121 further includes a transparent electrode layer 123. It should be noted that, for clarity and conciseness of description, similar parts in the flat panel detector can be referred to the relevant description in FIG. 2 and will not be repeated here.

For example, the transparent electrode layer 123 serves as a top electrode of the photosensitive element 122, and the second electrode 1123 of the thin film transistor 112 connected with the photosensitive element 122 through the conductive connection portion 1142 serves as a bottom electrode of the photosensitive element 122. For example, the top electrode is connected with a bias voltage line 105 illustrated in FIG. 1A and receives a constant voltage (e.g., −6V) provided by the bias voltage line 105. For example, upon the bias voltage line 105 supplying a negative bias voltage to the top electrode, the photosensitive element 122 is turned on, and upon being irradiated by visible light (for example, the visible light can be obtained by converting X-rays by an X-ray conversion layer), converts an optical signal into an electrical signal, which can be stored in a storage capacitor (not illustrated). During a signal reading process, the gate driving circuit 10 supplies gate scan signals to the pixel units row by row to turn on the thin film transistors 112 of the pixel units row by row, so that the electrical signal generated by the photosensitive element 122 is transmitted to the second electrode 1123 of the thin film transistor 112 through the conductive connection portion 1142. Because the thin film transistor 112 is turned on, the first electrode 1122 and the second electrode 1123 of the thin film transistor 112 are electrically connected. Therefore, the electric signal received by the second electrode 1123 can be transmitted to the signal amplifying and reading circuit 101 through the first electrode 1122 of the conductive thin film transistor 112 for subsequent processing, and the electric signal upon being processed can be used to form an image.

Figure 4:
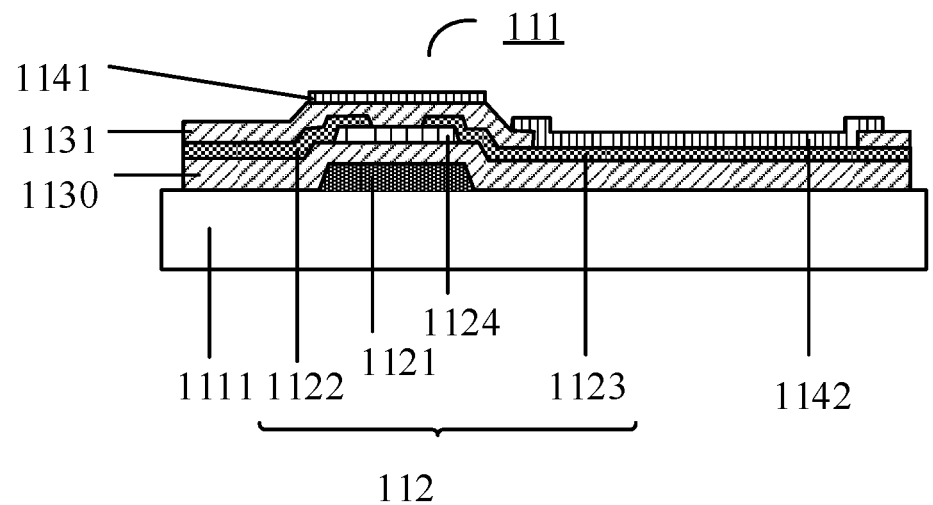
FIG. 4 is a schematic structural diagram of a first substrate in a flat panel detector provided by some embodiments of the present disclosure.

FIG. 4 is a schematic structural diagram of the first substrate 111 of the flat panel detector illustrated in FIG. 3. As illustrated in FIG. 4, on the basis of the exemplary embodiment illustrated in FIG. 2, the first substrate 111 further includes a light shielding layer 1141 and a conductive connection portion 1142 that are formed on the first passivation layer 1131.

For example, the light shielding layer 1141 covers directly above the driving circuit 112, for example, the light shielding layer 1141 is located at a side of the driving circuit 112 away from the first substrate 111, so as to be closer to the second substrate 121, i.e., closer to the photosensitive element 122 than the driving circuit 112. For example, the light shielding layer 1141 may include an opaque material such as a metal electrode, dark resin, and the like, thereby playing a light shielding role for the driving circuit 112 and preventing the transmitted visible light from affecting the performance of the driving circuit 112.

For example, the conductive connection portion 1142 is electrically connected with the driving circuit 112, is provided on a surface of the first substrate 111, and is electrically connected with the photosensitive element 122. For example, the first passivation layer 1131 includes an opening region (including a via hole), and the conductive connection portion 1142 is disposed in the opening region. For example, in the case where the light shielding layer is made of a material such as a metal, the conductive connection portion 1142 may be made of the same material as that of the light shielding layer 1141. Of course, in the case where the flat panel detector includes a conductive adhesive, the conductive connection portion 1142 may be a conductive adhesive or a conductive spacer, or other conductive materials, so that the second electrode 1123 of the thin film transistor 112 may be connected with the photosensitive element 122 through the conductive connection portion 1142, thereby realizing the transmission of electrical signals. The conductive connection portion 1142 may also be a part of the second electrode 1123 of the thin film transistor 112, for example, is connected with the photosensitive element 122 through the opening area of the first passivation layer 1131, which is not limited in the embodiment of the present disclosure.

For example, a third passivation layer (not illustrated) may also be formed on the light shielding layer 1141. For example, the third passivation layer serves as a planarization layer so that the first substrate 111 has a substantially flat surface so as to be bonded with the photosensitive element 122 in the second substrate 121 by a conductive adhesive.

Figure 5:
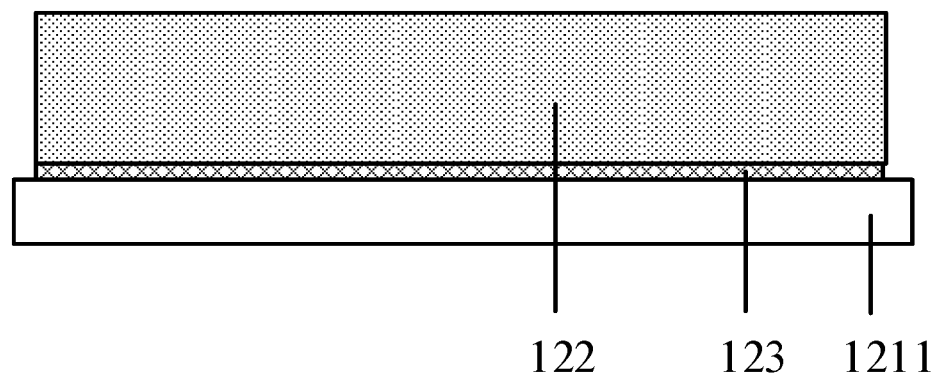
FIG. 5 is a schematic structural diagram of a second substrate in a flat panel detector provided by some embodiments of the present disclosure.

FIG. 5 is a schematic structural diagram of the second substrate 121 of the flat panel detector illustrated in FIG. 3. As illustrated in FIG. 5, based on the exemplary embodiment illustrated in FIG. 2, the second substrate 121 further includes a transparent electrode layer 123 on a base substrate of the second substrate 121 and a photosensitive element 122 on the transparent electrode layer 123. For example, the second substrate 121 further includes the base substrate (not illustrated) and the transparent electrode layer 123 is formed on the base substrate, the photosensitive element 122 is disposed at a side of the transparent electrode layer 123 away from the base substrate and is electrically connected with the transparent electrode layer 123.

For example, the transparent electrode layer 123 may be made of a material including a transparent metal oxide such as indium tin oxide (ITO) or indium zinc oxide (IZO).

For example, the second substrate 121 may further include a bias voltage line (not illustrated) and the like, and the bias voltage line may be connected with the transparent electrode layer 123 through a via hole in a passivation layer provided on the transparent electrode layer 123, thereby providing a constant negative bias voltage for the transparent electrode layer so that the photosensitive element 122 is in an operating state.

For example, the flat panel detector illustrated in FIG. 2 and FIG. 3 may also include a scan circuit (e.g., the gate driving circuit 10 illustrated in FIG. 1) and a voltage reading circuit (e.g., the signal amplifying and reading circuit 101 illustrated in FIG. 1A).

For example, the scan circuit is connected with the driving circuit 112 and is configured to provide a scan signal to control the driving circuit 112. For example, the scan circuit may be the gate driving circuit 10 illustrated in FIG. 1A. It should be noted that the gate driving circuit 10 can be prepared as an integrated circuit chip or a gate driving circuit of GOA (Gate driver On Array) type, the integrated circuit chip is electrically connected with the gate line through bonding, and the gate driving circuit of GOA type may include a plurality of cascaded shift register units, which may adopt 4T1C or other structures in the art, and will not be described here. For example, the thin film transistors constituting the gate driving circuit can be obtained by the same semiconductor manufacturing process, and the specific manufacturing process may refer to the manufacturing process of the driving circuit 112 in the flat panel detector illustrated in FIG. 2.

For example, the voltage reading circuit is connected with the driving circuit 112, and is configured to read the voltage signal generated by the photosensitive element 122 through the driving circuit 112. For example, the voltage reading circuit may be the signal amplifying and reading circuit 101 illustrated in FIG. 1A, and the voltage signal read by the voltage reading circuit may be subjected to amplification, analog-to-digital conversion and other processing to obtain a digital signal, and the digital signal is transmitted to an image processing unit (e.g., CPU, GPU, etc.) to form a corresponding image.

It should be noted that, for clarity and conciseness, the embodiment of the present disclosure does not provide all components of the flat panel detector. In order to realize the base function of the flat panel detector, those skilled in the art can provide other structures not illustrated according to specific requirements, which are not limited in the embodiments of the present disclosure.

For the flat panel detector provided by the above embodiment of the present disclosure, on the one hand, the manufacturing process of the flat panel detector is relatively simple, and is formed by assembling two oppositely disposed substrates; and in this structure, the photosensitive element can be disposed on an entire surface of one of the substrates, thus the filling rate (i.e., photosensitive area) of the photosensitive element in the pixel unit can be effectively improved, and the photosensitive performance of the flat panel detector can be improved, so that the flat panel detector can be applied to the field of fine diagnosis and the like; on the other hand, the upper and lower surfaces of the flat panel detector are made of substrate materials, so that static electricity and scratches can be effectively prevented and the photoelectric characteristics and yield of the flat panel detector can be improved in the process of detecting or attaching the flat panel detector with the scintillator.

Figure 6:
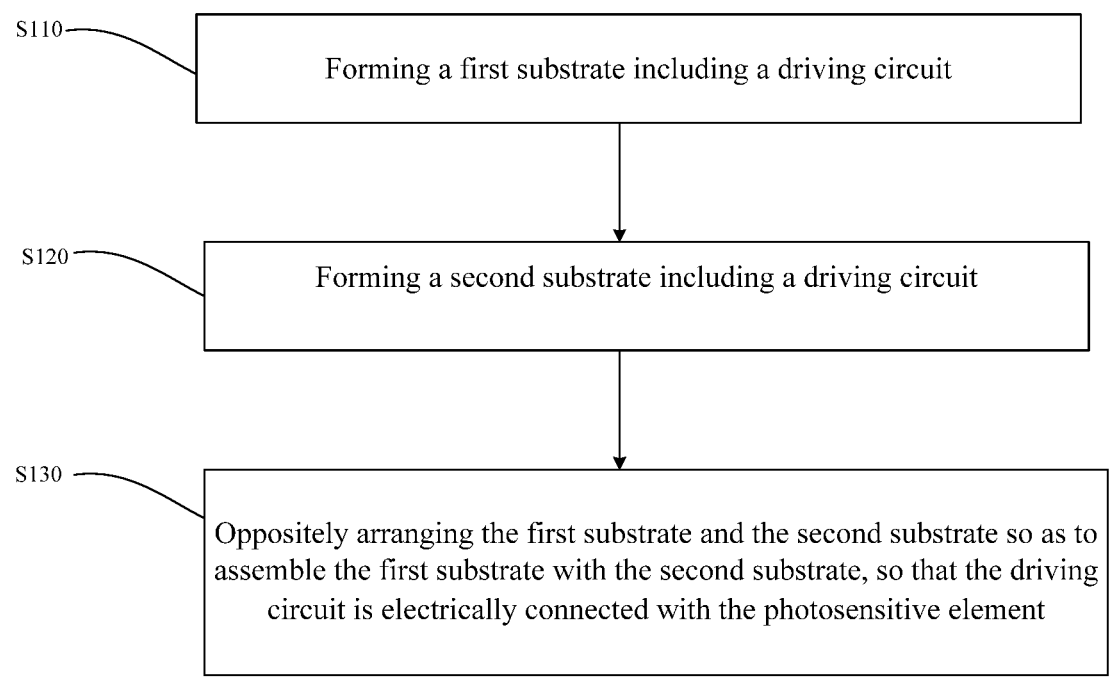
FIG. 6 is a flowchart of a manufacturing method of a flat panel detector provided by some embodiments of the present disclosure.

An embodiment of the present disclosure further provides a manufacturing method of a flat panel detector. FIG. 6 illustrates a flow chart of a manufacturing method of a flat panel detector. For example, the manufacturing method can be used to obtain the flat panel detector provided by any embodiment of the present disclosure. For example, the flat panel detector illustrated in FIG. 2 can be obtained, and the flat panel detector illustrated in FIG. 3 can also be obtained. As illustrated in FIG. 6, the manufacturing method of the flat panel detector includes steps S110 to S130.

Step S110: forming a first substrate including a driving circuit.

Step S120: forming a second substrate including a driving circuit.

Step S130: oppositely arranging the first substrate and the second substrate so as to assemble the first substrate with the second substrate, so that the driving circuit is electrically connected with the photosensitive element.

In step S110, for example, in the case where the driving circuit 112 is a thin film transistor, the manufacturing method of the thin film transistor includes: firstly, forming a gate electrode 1121 of the thin film transistor 112 on a first substrate 111; sequentially forming a gate insulation layer 1130 and an active layer 1124 on the gate electrode 1121; forming a first electrode (e.g., a source electrode) 1122 and a second electrode (e.g., a drain electrode) 1123 of the thin film transistor 112 on the active layer 1124. The detailed description of this step S110 may refer to the description of the first substrate 111 of the flat panel detector illustrated in FIG. 2 and FIG. 3 and will not be repeated here.

In step S120, for example, in the case where the photosensitive element 122 is a photodiode of PIN type, the manufacturing method of the photodiode of PIN type includes: sequentially forming a P-type layer, an I-type layer, and an N-type layer of the photodiode on the second substrate. For example, the photosensitive element 122 may be formed on an entire surface of the second substrate 121, thereby improving the filling rate of the photosensitive element 122, increasing the photosensitive area of the flat panel detector, and improving the photosensitive performance of the flat panel detector. For example, the detailed description of step S120 may refer to the description of the second substrate 121 of the flat panel detector illustrated in FIG. 2 and FIG. 3, and will not be repeated here.

In step S130, assembling the first substrate 111 with the second substrate 121 as illustrated in FIG. 2 or FIG. 3, for example, bonding the first substrate 111 with the second substrate 121 together by using a sealant. For example, a first passivation layer 1131 is also formed on the first substrate 111 so that the first substrate 111 has a substantially flat surface. For example, the first passivation layer 1131 includes a via hole, and the second electrode 1123 of the thin film transistor 112 may be electrically connected with the photosensitive element 122 included in the second substrate 112 through the via hole in the first passivation layer 1131. For example, in step S130, the driving circuit 112 and the photosensitive element 122 may be at least partially overlapped in a direction in which the first substrate 111 and the second substrate 122 are opposite to each other.

For example, in some exemplary embodiments, step S130 further includes: providing a conductive adhesive between the first substrate 111 and the second substrate 121 to bond and assemble the first substrate 111 with the second substrate 121. For example, in this exemplary embodiment, the conductive adhesive may be disposed between the first passivation layer 1131 and the photosensitive element 122 to further bond and assemble the first passivation layer 1131 with the photosensitive element 122, that is, the first substrate 111 and the second substrate 121 are assembled and bonded. For example, the conductive adhesive may refer to the detailed description of the embodiment illustrated in FIG. 2, and will not be described here.

For example, in some exemplary embodiments, step S110 further includes: providing a light shielding layer 1141 directly above the driving circuit 112 to cover the driving circuit 112, so that the light shielding layer 1141 is closer to the second substrate 121 than the driving circuit 112 after oppositely arranging the first substrate 111 with the second substrate 121 so as to assemble the first substrate 111 with the second substrate 121. For example, the light shielding layer 1141 may include opaque materials such as metal electrodes, dark resin, and the like, thereby playing a light shielding role for the driving circuit 112 and preventing the transmitted visible light from affecting the performance of the driving circuit 112. For example, the light shielding layer 1141 may refer to the detailed description of the flat panel detector illustrated in FIG. 4, without repeated here.

For example, in some exemplary embodiments, step S110 further includes: forming a first passivation layer 1131 including an opening region on the driving circuit 112 and forming a conductive connection portion 1142 in the opening region of the first passivation layer 1131 to connect the driving circuit 112 with the photosensitive element 122. For example, in the case where the light shielding layer is made of a material such as a metal electrode, the conductive connection portion 1142 may be made of the same material as that of the light shielding layer 1141. Of course, in the case where the flat panel detector includes a conductive adhesive, the conductive connection portion 1142 may be a conductive adhesive or a conductive spacer, or other conductive materials, so that the second electrode 1123 of the thin film transistor 112 may be connected with the photosensitive element 122 through the conductive connection portion 1142, thereby realizing the transmission of electrical signals. The conductive connection portion 1142 may also be a part of the second electrode 1123 of the thin film transistor 112, for example, is connected with the photosensitive element 122 through the opening area of the first passivation layer 1131, which is not limited in the embodiment of the present disclosure.

For example, in some exemplary embodiments, step S120 may further includes: forming a transparent electrode layer 123 on a base substrate of the second substrate 121, and forming a photosensitive element 122 on the transparent electrode layer 123. For example, the photosensitive element 122 is disposed at a side of the transparent electrode layer 123 away from the base substrate and is electrically connected with the transparent electrode layer 123. For example, the transparent electrode layer 123 may be made of a material including a transparent metal oxide such as indium tin oxide (ITO) or indium zinc oxide (IZO). For example, the transparent electrode layer 123 may refer to the detailed description of the flat panel detector illustrated in FIG. 5, without repeated here.

For example, the manufacturing method of the flat panel detector further includes: fabricating a scan circuit, a voltage reading circuit, a bias voltage line, and other structures in a peripheral region of the array substrate.

For example, forming a bias voltage line on the second substrate 121 so that the bias voltage line is connected with the transparent electrode layer 123 through a via hole in a passivation layer provided on the transparent electrode layer 123, thereby providing a constant negative bias voltage to the transparent electrode layer so that the photosensitive element 122 is in an operating state.

For example, the scan circuit (e.g., gate driving circuit 10 as illustrated in FIG. 1) is connected with the driving circuit 112 and configured to provide a scan signal to control the driving circuit 112. For example, the scan circuit may be the gate driving circuit 10 illustrated in FIG. 1A. It should be noted that the gate driving circuit 10 may be prepared as an integrated circuit chip or a gate driving circuit of GOA type, the integrated circuit chip is electrically connected with the gate line through bonding, and the gate driving circuit of GOA type may include a plurality of cascaded shift register units, which may adopt 4T1C or other conventional structures in the art, without repeated here. For example, the thin film transistors constituting the gate driving circuit may be obtained by the same semiconductor fabricating process.

For example, a voltage reading circuit (e.g., the signal amplifying and reading circuit 101 illustrated in FIG. 1A) is connected with the driving circuit 112, and is configured to read a voltage signal generated by the photosensitive element 122 through the driving circuit 112. For example, the voltage reading circuit may be the signal amplifying and reading circuit 101 illustrated in FIG. 1A, and the voltage signal read by the voltage reading circuit may be subjected to amplification, analog-to-digital conversion and other processing to obtain a digital signal, and the digital signal is transmitted to an image processing unit (e.g., CPU, GPU, etc.) to form a corresponding image. For example, the signal amplifying and reading circuit 101 may be an integrated circuit chip.

It should be noted that in the embodiments of the present disclosure, the flow of the manufacturing method of the flat panel detector may include more or less operations, which may be performed sequentially or in parallel. Although the flow of the manufacturing method described above includes a plurality of operations occurring in a specific order, it should be clearly understood that the order of the plurality of operations is not limited. The manufacturing method described above can be performed once or multiple times according to predetermined conditions.

Regarding the technical effect of the manufacturing method of the flat panel detector provided by the above embodiments, reference may be made to the technical effect of the flat panel detector provided by the embodiment of the present disclosure, without repeated here.

The following statements should be noted.

(1) The accompanying drawings involve only the structure(s) in connection with the embodiment(s) of the present disclosure, and other structure(s) may be referred to common design(s).

(2) In case of no conflict, features in one embodiment or in different embodiments can be combined.

The foregoing is only specific embodiments of the present disclosure, without construing any limitation to the protection scope of the present disclosure. Therefore, the protection scope of the present disclosure should be based on protection scope of the claims.

What is claimed is:

1. A flat panel detector, comprising a first substrate and a second substrate,
   wherein the first substrate comprises a driving circuit, the second substrate comprises a photosensitive element,
   the first substrate and the second substrate are arranged opposite to each other so as to be assembled, and the driving circuit is electrically connected with the photosensitive element to drive the photosensitive element,
   wherein the first substrate further comprises a conductive connection portion, and
   the conductive connection portion is electrically connected with the driving circuit, is disposed on a surface of the first substrate, and is electrically connected with the photosensitive element,
   wherein the conductive connection portion is in contact with the photosensitive element.

2. The flat panel detector according to claim 1, wherein the conductive connection portion comprises a metal electrode, a conductive adhesive or a conductive spacer.

3. The flat panel detector according to claim 1, wherein the first substrate further comprises a first passivation layer,
   the first passivation layer is disposed between the conductive connection portion and the driving circuit,
   the first passivation layer comprises an opening region, and
   the conductive connection portion is disposed in the opening region.

4. The flat panel detector according to claim 3, wherein the first passivation layer is a planarization layer so that the first substrate has a substantially flat surface.

5. The flat panel detector according to claim 1, wherein the second substrate further comprises a base substrate and a transparent electrode layer formed on the base substrate, and
   the photosensitive element is disposed at a side of the transparent electrode layer away from the base substrate and is electrically connected with the transparent electrode layer.

6. The flat panel detector according to claim 1, further comprising a conductive adhesive, wherein the conductive adhesive is disposed between the first substrate and the second substrate to bond and assemble the first substrate with the second substrate.

7. The flat panel detector according to claim 1, wherein the driving circuit and the photosensitive element are at least partially overlapped in a direction in which the first substrate and the second substrate are right opposite to each other.

8. The flat panel detector according to claim 1, wherein the first substrate further comprises a light shielding layer,
   wherein the light shielding layer is disposed at a side of the driving circuit away from the first substrate, so as to be closer to the second substrate than the driving circuit,
   wherein the light shielding layer is in contact with the photosensitive element.

9. The flat panel detector according to claim 1, wherein the first substrate comprises a first base substrate, the second substrate comprises a second base substrate, and the first base substrate or the second base substrate is made of glass or plastic.

10. The flat panel detector according to claim 1, wherein the photosensitive element comprises a photodiode, and
    the photodiode is a photodiode of PIN type or a photodiode of PN type.

11. A manufacturing method of a flat panel detector, comprising:
    forming a first substrate comprising a driving circuit;
    forming a second substrate comprising a photosensitive element; and
    oppositely arranging the first substrate and the second substrate so as to assemble the first substrate with the second substrate, so that the driving circuit is electrically connected with the photosensitive element;
    wherein the manufacturing method further comprises:
    forming a first passivation layer comprising an opening region on the driving circuit; and
    forming a conductive connection portion in the opening region to connect the driving circuit with the photosensitive element,
    wherein the conductive connection portion is in contact with the photosensitive element.

12. The manufacturing method according to claim 11, further comprising:
    providing a light shielding layer at a side of the driving circuit away from the first substrate, so that the light shielding layer is closer to the second substrate than the driving circuit after oppositely arranging the first substrate and the second substrate so as to assemble the first substrate with the second substrate,
    wherein the light shielding layer is in contact with the photosensitive element.

13. The manufacturing method according to claim 11, wherein forming the second substrate comprising the photosensitive element comprises forming a transparent electrode layer on a base substrate of the second substrate, and forming the photosensitive element at a side of the transparent electrode layer away from the second substrate.

14. The manufacturing method according to claim 11, further comprising:
    providing a conductive adhesive between the first substrate and the second substrate to bond and assemble the first substrate with the second substrate.

15. The manufacturing method according to claim 12, wherein the light shielding layer and the conductive connection portion are in contact with the first passivation layer, respectively.

16. The manufacturing method according to claim 12, wherein the driving circuit comprises an active layer and a gate electrode, the gate electrode and the light shielding layer are arranged at two opposite sides of the active layer, respectively.

17. The manufacturing method according to claim 12, wherein an interval is provided between the light shielding layer and the conductive connection portion in a direction parallel with the first substrate.

18. The flat panel detector according to claim 8, wherein the light shielding layer and the conductive connection portion are in contact with the first passivation layer, respectively.

19. The flat panel detector according to claim 8, wherein the light shielding layer is made of metal, and the light shielding layer and the conductive connection portion have a same material.

20. The flat panel detector according to claim 8, wherein an interval is provided between the light shielding layer and the conductive connection portion in a direction parallel with the first substrate.

* * * * *